US012596934B2

(12) United States Patent
Chang

(10) Patent No.: US 12,596,934 B2
(45) Date of Patent: Apr. 7, 2026

(54) PREDICTION-MODEL-BUILDING METHOD, STATE PREDICTION METHOD AND DEVICES THEREOF

(71) Applicant: WISTRON CORP., New Taipei City (TW)

(72) Inventor: Yao-Tsung Chang, New Taipei City (TW)

(73) Assignee: WISTRON CORP., New Taipei City (TW)

( * ) Notice: Subject to any disclaimer, the term of this patent is extended or adjusted under 35 U.S.C. 154(b) by 927 days.

(21) Appl. No.: 17/706,665

(22) Filed: Mar. 29, 2022

(65) Prior Publication Data

US 2023/0186112 A1 Jun. 15, 2023

(30) Foreign Application Priority Data

Dec. 15, 2021 (TW) ................................. 110147006

(51) Int. Cl.
*G06F 18/214* (2023.01)
*G06F 30/27* (2020.01)
(Continued)

(52) U.S. Cl.
CPC ............. *G06N 5/022* (2013.01); *G06F 30/27* (2020.01); *G06N 5/04* (2013.01); *G06N 20/00* (2019.01)

(58) Field of Classification Search
CPC .......... G06N 5/022; G06N 5/04; G06N 20/00; G06F 30/27
See application file for complete search history.

(56) References Cited

U.S. PATENT DOCUMENTS

| | | | | |
|---|---|---|---|---|
| 10,733,515 B1 * | 8/2020 | Mishra | ..................... | G06N 5/04 |
| 2019/0034595 A1 * | 1/2019 | Sun | ......................... | G16H 50/30 |
| 2023/0177119 A1 * | 6/2023 | Zhang | ..................... | G06F 18/27 |
| | | | | 706/12 |

FOREIGN PATENT DOCUMENTS

| | | |
|---|---|---|
| CN | 113096814 A | 7/2021 |
| KR | 102251139 B1 | 5/2021 |

OTHER PUBLICATIONS

Mertens et al. "Construction and assessment of prediction rules for binary outcome in the presence of missing predictor data using multiple imputation and crossâvalidation: Methodological approach and dataâbased evaluation." Biometrical Journal 62.3 (2020) (Year: 2020).*

(Continued)

*Primary Examiner* — Cesar B Paula

(74) *Attorney, Agent, or Firm* — McClure, Qualey & Rodack, LLP

(57) ABSTRACT

A prediction-model-building method includes: generating a plurality of pieces of augmented training data after a piece of training data with a missing item is determined; constituting a training dataset comprising pieces of training data without any missing item and the plurality of pieces of augmented training data; and building a prediction model based on the training dataset by a machine-learning algorithm. Similarly, a state prediction method includes: generating a plurality of pieces of estimation augmented data after a piece of source data with a missing item is determined;

(Continued)

inputting the said plurality of pieces of estimation augmented data into a prediction model; and outputting a predicted state based on the output of the prediction model. Devices for performing the above methods are also disclosed.

20 Claims, 10 Drawing Sheets

(51) Int. Cl.
  *G06N 5/022*          (2023.01)
  *G06N 5/04*           (2023.01)
  *G06N 20/00*          (2019.01)

(56) References Cited

OTHER PUBLICATIONS

Austin, Peter C., et al. "Missing data in clinical research: a tutorial on multiple imputation." Canadian Journal of Cardiology 37.9 ( 2021): 1322-1331. (Year: 2021).*
Von Hippel, Paul T. "Should a normal imputation model be modified to impute skewed variables?." Sociological Methods & Research 42.1 (2013): 105-138. (Year: 2013).*
Isa, Iza Sazanita, et al. "Weather forecasting using photovoltaic system and neural network." 2010 2nd international conference on computational intelligence, communication systems and networks. IEEE, 2010. (Year: 2010).*
Heo, Giseon, et al. "Interdisciplinary Approaches to Automated Obstructive Sleep Apnea Diagnosis Through High-Dimensional Multiple Scaled Data Analysis." Research in Data Science (2019): 81-107. (Year: 2019).*
Royle, Kara-Louise, and David A. Cairns. "The development and validation of prognostic models for overall survival in the presence of missing data in the training dataset: a strategy with a detailed example." Diagnostic and prognostic research 5.1 (2021): 14. (Year: 2021).*
TW Office Action dated Aug. 10, 2022 in Taiwan application No. 110147006.
Schmitt, et al.: "A Comparison of Six Methods for Missing Data Imputation"; Department of Bioinformatics and Biostatistics, Pharnext, Paris, France; http://dx.doi.org/10.472/2155-6180.1000224; ISSN: 2155-6180 JBMBS, an open access journal; vol. 6, Issue 1; pp. 1-6.
Biessmann, et al.: ""Deep" Learning for Missing Value Imputation in Tables with Non-Numerical Data"; Industry and Case Study Paper; CIKM'18, Oct. 22-26, 2018, Torino, Italy; pp. 2017-2025.
CN Office Action dated Aug. 2, 2025 in Chinese application No. 202210037329.X.

* cited by examiner

PREDICTION-MODEL-BUILDING METHOD, STATE PREDICTION METHOD AND DEVICES THEREOF

CROSS-REFERENCE TO RELATED APPLICATIONS

This non-provisional application claims priority under 35 U.S.C. § 119(a) on Patent Application No(s). 110147006 filed in Taiwan on Dec. 15, 2021, the entire contents of which are hereby incorporated by reference.

BACKGROUND

1. Technical Field

The disclosure relates to an application of a machine-learning algorithm and especially relates to a prediction-model-building method, a state prediction method and devices thereof, which can maintain reference data amount needed to build a prediction model or can generate a precise state prediction result under a circumstance that the values in a piece of data is partially missing.

2. Related Art

In the process of building a prediction model by a machine-learning algorithm with training data, or in the process of inputting the obtained data to a prediction model to acquire a prediction result, it frequently happens that an item in the training data or the obtained data is blank or has unidentifiable contents, which leads the training data to be an invalid training data or inability in generating the prediction result of the obtained data.

In the following, performing a body prediction according to physiological information is taken as an example. When data collection is performed by machine-learning in collaboration with a Doppler radar and personal information of a testee, pieces of radar data are obtained by scanning and non-radar data is obtained by form-filling out or prebuilt files from a computer system. Because parts of the personal information of the testee, such as sex, age, height, weight and so on, may be deliberately skipped due to privacy reasons, one or more pieces of the non-radar data may be blank. On the other hand, because the radar data is obtained by scanning, the radar data is seldom missing unless there is an error in generating or saving of the radar data.

The missing part in the above situation usually results in the failure of the entire dataset from this. In the process of building a prediction model, the accuracy of this prediction model can be largely affected if the data amount of the training data thereof is lowered due to too many collected data having one or more blanks in the filled form. On the other hand, in the process of state prediction to a testee, the prediction model may be unable to generate the prediction result due to the incomplete data from the testee. Accordingly, it is necessary to overcome the problems in the conventional ways of building and using prediction models, so as to enhance the implementation of training data and obtained data in related industries.

SUMMARY

In light of aforementioned known issues, a purpose of the present disclosure is to maintain the data amount needed for building a prediction model or generating a precise state prediction result under a circumstance that one or more parts of the collected data is incomplete.

According to one embodiment of the present disclosure, the present disclosure sets forth a prediction-model-building method provided for a processor to perform and the prediction-model-building method comprises: receiving a plurality of pieces of training data, with each of the plurality of pieces of training data comprising a plurality of training feature items and with each of the plurality of training feature items configured to record a training eigenvalue; determining whether each of the plurality of training feature items of each of the plurality of training data records the training eigenvalue or not; determining a training feature item without the training eigenvalue as a training missing item, determining a piece of training data comprising the training missing item as a defective piece of training data, generating a plurality of training augmented values corresponding to the training missing item of the defective piece of training data and, based on the plurality of training augmented values, generating a plurality of pieces of augmented training data corresponding to the defective piece of training data; constituting a training dataset at least comprising the plurality of pieces of augmented training data and pieces of training data without the training missing item; and generating a prediction model by a machine-learning algorithm based on the training dataset and storing or outputting the prediction model.

According to another embodiment of the present disclosure, the present disclosure sets forth a state prediction method provided for a processor to perform and the state prediction method comprises: receiving a piece of source data, with the piece of source data comprising a plurality of estimation feature items and with each of the plurality of estimation feature items configured to record an estimation eigenvalue; determining whether each of the plurality of estimation feature items records the training eigenvalue or not; determining the estimation feature item without the estimation eigenvalue as an estimation missing item, generating a plurality of estimation augmented values corresponding to the estimation missing item and, based on the plurality of estimation augmented values, generating a plurality of pieces of augmented estimation data; inputting the plurality of pieces of augmented estimation data to a prediction model to generate a plurality of initial estimation results; and determining a state predicting result associated with the piece of source data from the plurality of initial estimation results and storing or outputting the state predicting result.

In addition to the foregoing prediction-model-building method, one embodiment of the present disclosure sets forth a prediction-model-building device and the prediction-model-building device comprises a memory and a processor. The memory stores a machine-learning algorithm. The processor is coupled to the memory to access the machine-learning algorithm and performs the foregoing prediction-model-building method.

In addition to the foregoing state prediction method, one embodiment of the present disclosure sets forth a state prediction device and the state prediction device comprises a memory and a processor. The memory stores a prediction model. The processor is coupled to the memory to access the prediction model and perform the foregoing state prediction method.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown to simplify the drawings.

Figure 1:
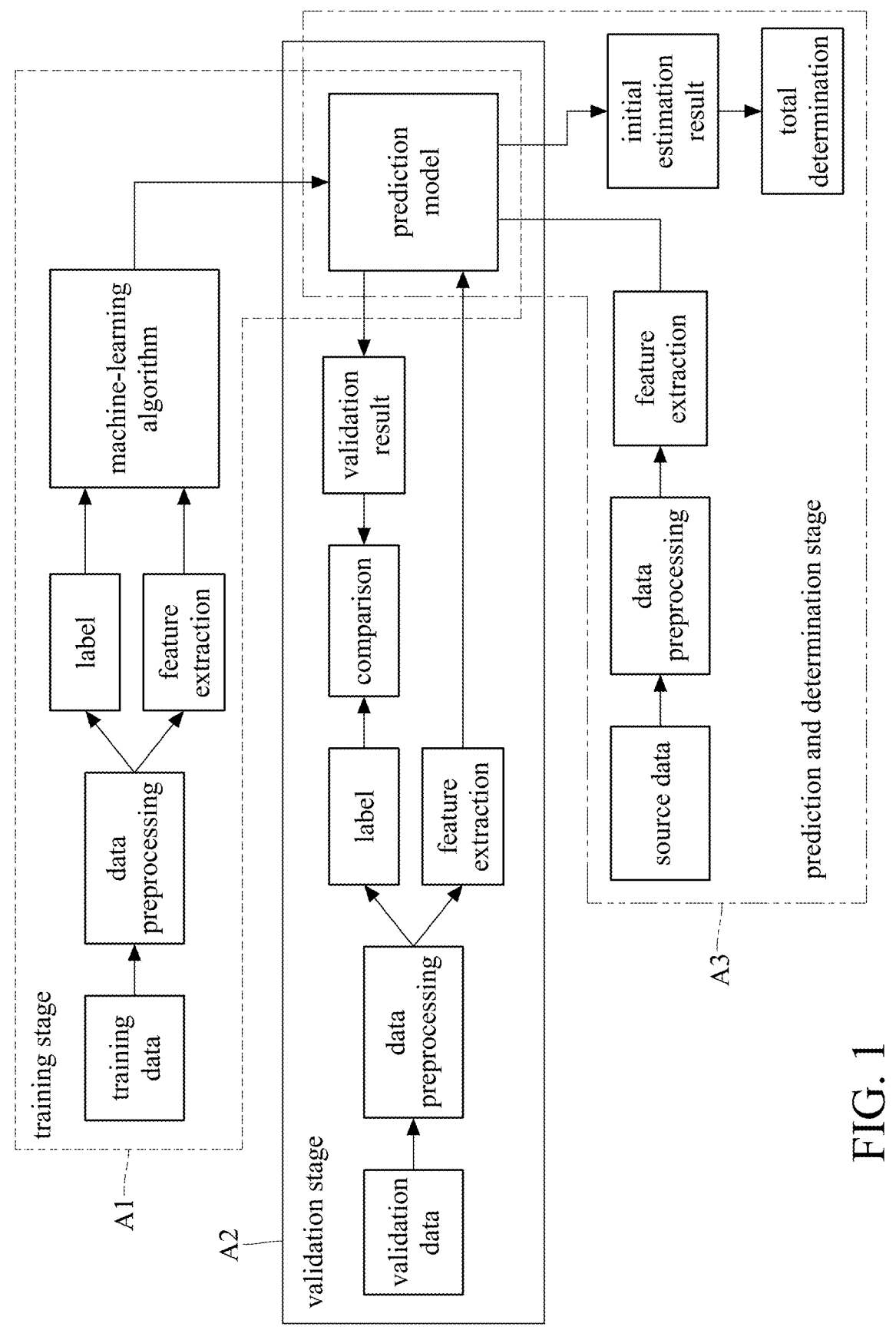
FIG. 1 is an entire configuration diagram including a prediction-model-building part and a state prediction part according to one embodiment of the present disclosure.

Please refer to FIG. 1, which is an entire configuration diagram including a prediction-model-building part and a state prediction part according to one embodiment of the present disclosure. Specifically, the prediction-model-building part at least includes a training stage A1 to train a prediction model based on a plurality of pieces of training data. The prediction-model-building part may further include a validation stage A2 to validate the prediction model based on a plurality of pieces of validation data, so as to ensure the accuracy thereof. With the validation stage A2, the method of the present disclosure may adjust a parameter of the prediction model to improve the accuracy of the prediction model, or may perform the training stage A1 again after reprocessing the plurality of pieces of training data so as to obtain a new prediction model. The state prediction part in the present embodiment may be regarded as a prediction and determination stage A3 configured to predict a state of a test object (or a testee) according to a prediction model and a piece of source data related to a test object or a testee. Preferably, as illustrated by FIG. 1, the prediction model may be a prediction model obtained by the training stage A1 at least, a prediction model obtained by the training stage A1 and the validation stage A2. However, the way for obtaining the prediction model used in the prediction and determination stage A3 may be other than what is disclosed above, which is not limited to the present disclosure. On the whole, in any one of the training stage A1, the validation stage A2 and the state prediction determination stage A3 of the present embodiment, the pieces of training data, validation data or source data therein may be preprocessed to maintain the applicability of the pieces of data with the idea of augmentation or complement toward defective items therein.

Figure 2:
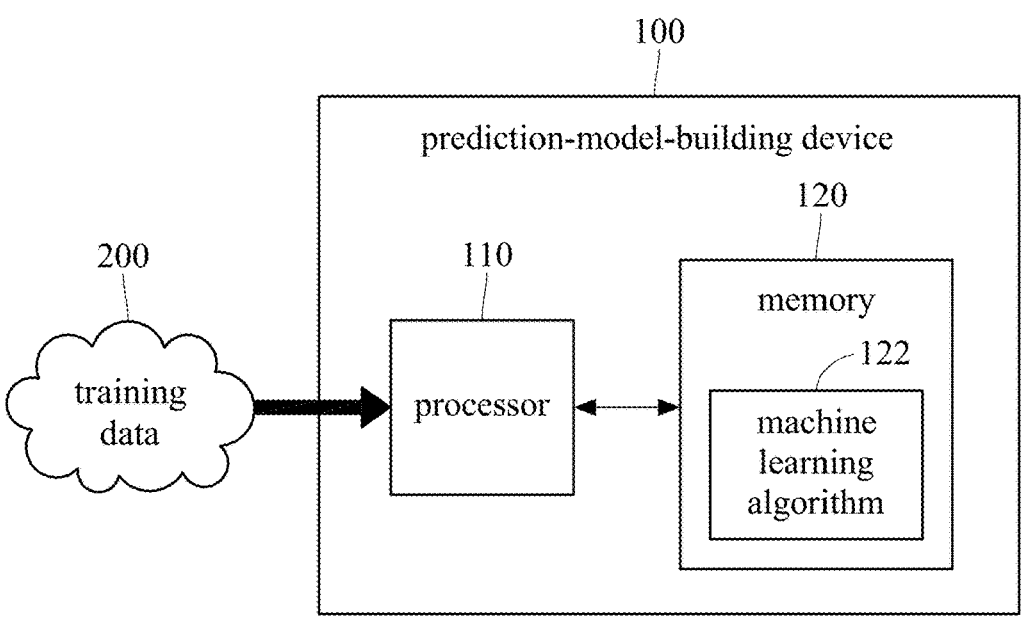
FIG. 2 is a system configuration diagram of the prediction-model-building device according to one embodiment of the present disclosure.

Please refer to FIG. 2, which is a system configuration diagram of the prediction-model-building device according to one embodiment of the present disclosure. The prediction-model-building device 100 comprises a processor 110 and a memory 120. The processor 110 and the memory 120 may be disposed in a server. Alternatively, the processor 110 may be disposed in a server internet-connected to the memory 120. The memory 120 may store a machine-learning algorithm 122, but the present disclosure is not thus limited thereto, while the memory 120 may further store data of other types. The processor 110 is coupled to the memory 120 to access the machine-learning algorithm 122 stored in the memory 120. Besides, the processor 110 at least performs the following prediction-model-building method based on the plurality of pieces of training data transmitted by a data source 200 to build a prediction model.

Figure 3:
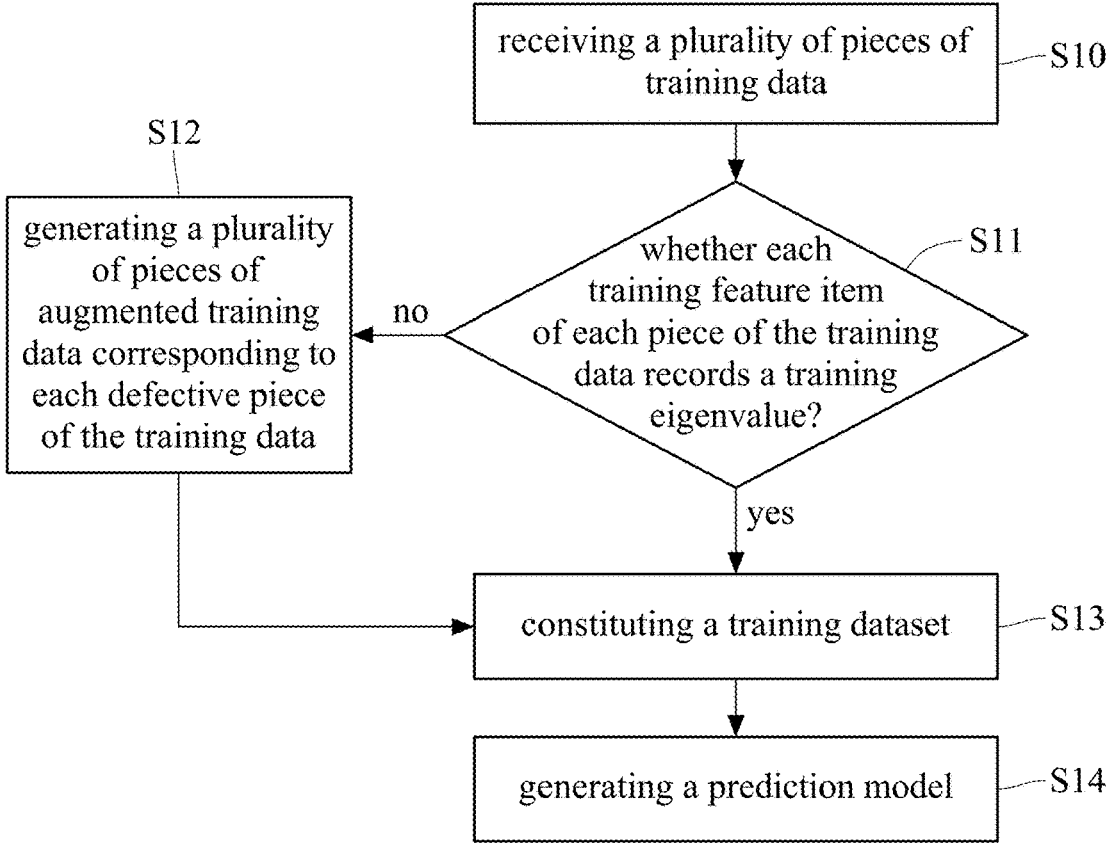
FIG. 3 is a flowchart of the prediction-model-building method according to one embodiment of the present disclosure.

Please refer to FIG. 1 to FIG. 3, where FIG. 3 is a flowchart of the prediction-model-building method according to one embodiment of the present disclosure. The prediction-model-building method in the present embodiment corresponds to the training stage A1 in FIG. 1 and includes steps S10-S14. In step S10, the processor 110 of the prediction-model-building device 100 receives the plurality of pieces of training data from the data source 200. When the prediction-model-building method of the present embodiment is performed to build a prediction model for determining a sleep breath state, the plurality of pieces of training data may be the content in the following table 1 for example. Specifically, each of the aforementioned plurality of pieces of training data (i.e. Data 1 to Data 10000 listed lengthways in table 1) comprises a plurality of training feature items (i.e. each of the plurality of pieces of training data in table 1 has the plurality of training feature items including sex, age, height, weight, health situation, radar data and determination result), and each of the plurality of training feature items is configured to record a training eigenvalue. (i.e. the training feature item about age in Data 1 listed in table 1 records 45 as the training eigenvalue). The plurality of training feature items comprises at least one non-measured feature item, such as sex, age, height and weight, which is obtained by form-filling instead of measurement.

TABLE 1

| Data | Gender | Age | Height (cm) | Weight (kg) | Health situation | Radar data | Determination result |
|------|--------|-----|-------------|-------------|------------------|------------|-----------------------|
| Data 1 | Male | 45 | 165 | 71 | Healthy | Radar data 1 | Label 1 |
| Data 2 | Female | 51 | 158 | 48 | Healthy | Radar data 2 | Label 1 |
| Data 3 | Male | 62 | 168 | 75 | Respiratory Disease | Radar data 3 | Label 2 |
| Data 4 | Male | 53 | 176 | 82 | Respiratory Disease | Radar data 4 | Label 1 |
| Data 5 | Female | 64 | 164 | 54 | Healthy | Radar data 5 | Label 3 |
| Data 6 | Male | 47 | 176 | 81 | Healthy | Radar data 6 | Label 1 |
| Data 7 | Male | 22 | 167 | 85 | Healthy | Radar data 7 | Label 2 |
| Data 8 | Male | 76 | 166 | 62 | Healthy | Radar data 8 | Label 1 |
| . . . | . . . | . . . | . . . | . . . | . . . | . . . | . . . |
| Data i | Male | 72 | 166 | Blank | Healthy | Radar data i | Label 1 |
| Data i + 1 | . . . | . . . | . . . | . . . | . . . | . . . | . . . |
| . . . | . . . | . . . | . . . | . . . | . . . | . . . | . . . |
| Data 10000 | . . . | . . . | . . . | . . . | . . . | . . . | . . . |

In step S11, the processor 110 determines whether the plurality of training feature items of each of the plurality of pieces of training data records the training eigenvalue. Specifically, in step S11, the processor 110 examines the plurality of pieces of training data to find the training data with one or more defects. Taking the content of table 1 for example, when the processor 110 executes step S11 on Data 1 through Data 8, it is determined that the plurality of training feature items of the plurality of pieces of training data record training eigenvalues. However, when the processor 110 executes step S11 on Data i, the processor 110 determines that not each of the plurality of training feature items of Data i records a training eigenvalue since the training feature item about weight does not record the training eigenvalue (i.e. there is a defect in this training data as the "blank" shown in table 1). If the determination result of step S11 is "no", step S12 is then performed. If the determination result of step S11 is "yes", step S13 is thus performed.

In step S12, the processor 110 generates a plurality of pieces of augmented training data. Specifically, the processor 110 determines the training feature item without the training eigenvalue as a training missing item, and determines the training data having the training missing item, the training data with this defect namely, as a defective piece of training data. Taking Data i in table 1 for example, Data i is determined as the defective piece of training data, and the training feature item about "weight" of Data i is determined as the training missing item. Thereafter, the processor 10 generates a plurality of training augmented values corresponding to the training missing item of the defective piece of training data, and further generates a plurality of pieces of augmented training data corresponding to the defective piece of training data based on the plurality of training augmented values. Step S13 is then performed.

To clearly describe details of step S12, a further explanation as well as a table 2 is referred for a better understanding of the generation of the plurality of pieces of augmented training data. As listed in table 2, the plurality of pieces of augmented training data Data i_1 through Data i_8 may be generated for Data i in table 1. The method for generating the plurality of pieces of augmented training data Data i_1 through Data i_8 may be performed by generating eight training augmented values A through H in table 2 for the training missing item about "weight" and respectively filling in the eight training augmented values A through H into this training missing item of the training data Data i to obtain the plurality of pieces of augmented training data Data i_1 through Data i_8. The number of the training augmented values is referred as an example and is not thus limited. Specifically, determination of the foregoing training augmented values may be as follows: obtaining the corresponding training eigenvalues from the pieces of training data without the training missing item, while the corresponding training eigenvalues are recorded in the same training feature item of the plurality of pieces of training data, with said training feature item corresponding to the training missing item (Taking Data 1 through Data 8 in table 1 for example, values of 71, 48, 75, 82, 54, 81, 85 and 62 therein corresponding to the training missing item about "weight" in Data i are acquired); classifying the training eigenvalues to obtain a plurality of classified representative values (for example, 54, 71 and 82 may be picked to serve as the classified representative values according to distribution of the eight weight values after classifying the eight weight values); and setting the plurality of classified representative values as the plurality of training augmented values (in other words, three pieces of augmented training data are generated according to 54, 71 and 82 serving as the classified representative values, wherein the weight item in the three pieces of augmented training data are 54, 71 and 82 while the other items of these three pieces of augmented training data are the same as the other items of Data i). In another way, determination of the foregoing training augmented values may also be as follows: determining an acquisition range of the training missing item according to at least one training eigenvalue of the defective piece of training data, with said at least one training eigenvalue recorded in other items of the defective piece of training data other than the training missing item (for example, the weight value is typically not below 40 kg according to "male" in sex and "166 cm" in height of Data i, and thus the missing weight value in Data i is in the acquisition range of "more than 40 kg"; furthermore, the missing weight value in Data i may be further determined in the acquisition range as "40-70" with reference to "healthy" of the health situation in Data i); selecting values from the acquisition range to serve as the training augmented values (for example, 40, 45, 50, 55, 60, 65, 70 and 75 are selected from the acquisition range of 40-75 to serve as the training augmented values). The above ways for determination of the training augmented values are mentioned for example, and the present disclosure is not thus limited thereto.

illustrated by FIG. 1 (i.e. "label 1" recorded the item about the determination result as listed in Data 1 of table 1) in addition to what are listed in Data 1 of table 1, such as "male", "45", "165", "71", "healthy" and "Radar data 1" recorded respectively under the items about sex, age, height, weight, healthy situation and radar data records. Hence, these pieces of augmented training data and training data without the training missing item are utilized to conduct machine-learning. Furthermore, if the plurality of pieces of first augmented training data and second augmented training data are generated in step S12, the plurality of pieces of first

TABLE 2

| Data | Gender | Age | Height (cm) | Weight (kg) | Healthy situation | Radar data | Determination result |
|---|---|---|---|---|---|---|---|
| Data i_1 | Male | 72 | 166 | A | Healthy | Radar data i | Label 1 |
| Data i_2 | Male | 72 | 166 | B | Healthy | Radar data i | Label 1 |
| Data i_3 | Male | 72 | 166 | C | Healthy | Radar data i | Label 1 |
| Data i_4 | Male | 72 | 166 | D | Healthy | Radar data i | Label 1 |
| Data i_5 | Male | 72 | 166 | E | Healthy | Radar data i | Label 1 |
| Data i_6 | Male | 72 | 166 | F | Healthy | Radar data i | Label 1 |
| Data i_7 | Male | 72 | 166 | G | Healthy | Radar data i | Label 1 |
| Data i_8 | Male | 72 | 166 | H | Healthy | Radar data i | Label 1 |

Moreover, in case that a ratio of a number of the plurality of pieces of augmented training data to a total of the plurality of pieces of training data is too high, which may lead to a large error in the trained prediction model, the pieces of training data without the training missing item may be duplicated to balance effects resulted from the plurality of pieces of augmented training data. Specifically, the plurality of pieces of augmented training data is defined as a plurality of pieces of first augmented training data, and the pieces of training data without the training missing item may be duplicated to generate a plurality of pieces of copied training data, which are further defined as a plurality of pieces of second augmented training data. A ratio of the number of the pieces of original training data without the training missing item to the total of the pieces of second augmented training data and the pieces of original training data without the training missing item may be the same to the number of the pieces of first augmented training data. Thereby, the effects resulted from some of the plurality of pieces of first augmented training data with a large error to the actual situation can be balanced.

In step S13, the processor 10 constitutes a training dataset according to the foregoing plurality of pieces of augmented training data and pieces of training data without the training missing item (if there none of the pieces of training data is defected, the training dataset is the entire plurality of pieces of training data received in step S10). Specifically, each of the pieces of training data in the training dataset (including the plurality of pieces of augmented training data) further comprises a determination result marked by a label as augmented training data, second augmented training data and training data without the training missing item constitute the training dataset.

In step S14, the processor 110 may train and generate a prediction model by the machine-learning algorithm 122 in the memory 120 and the plurality of pieces of training data of the foregoing training dataset. The processor 110 may store the prediction model in the memory 120 or another storage device in the prediction-model-building device 100. Alternatively, the processor 110 may output the prediction model to other devices communicatively or electrically connected to the prediction-model-building device 100, such as a display, an internet server or a cloud storage.

Figure 4:
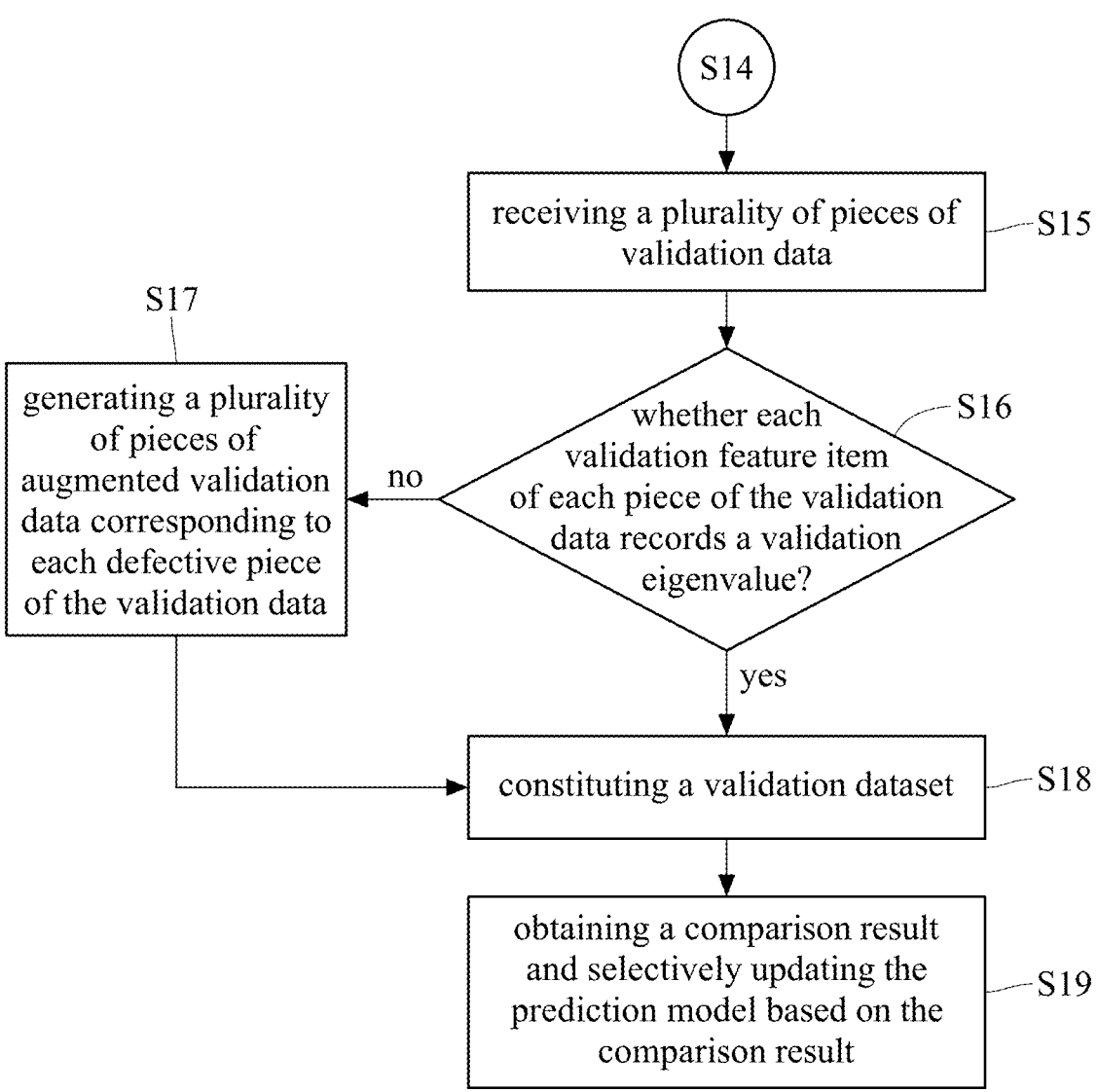
FIG. 4 is a flowchart of the prediction-model-building method according to another embodiment of the present disclosure.

Please refer to FIG. 1, FIG. 2 and FIG. 4, while FIG. 4 is a flowchart of the prediction-model-building method according to another embodiment of the present disclosure. The prediction-model-building method in the present embodiment further comprises the validation stage A2 illustrated in FIG. 1. In other words, the present embodiment further comprises steps S15-S19 corresponding to the validation stage A2 in addition to the foregoing steps S10-S14. Specifically, the present embodiment further validates the prediction model generated in the training stage A1 to determine whether to update the prediction model by a method such as adjusting parameters of the prediction model or reprocessing the plurality of pieces of training data and then performing the training stage A1 again. Hence, steps S15-S19 are subsequently performed after the prediction model is generated in step S14.

In the validation stage A2, steps S15-S18 perform the same contents in steps S10-S13 to a set of pieces of validation data different from the plurality of pieces of training data so as to generate a validation dataset. Specifically, in step S15, processor 110 receives a plurality of pieces of validation data (corresponding to the plurality of pieces of training data). Each of the plurality of pieces of validation data includes a plurality of validation feature items (corresponding to the plurality of training feature items), and each of the plurality of validation feature items is used to record a validation eigenvalue (corresponding to the training eigenvalue). In step S16, the processor 110 determines whether each of the plurality of pieces of validation data records the validation eigenvalue or not. In step S17, the processor 110 determines the validation feature item not recording a validation eigenvalue as a validation missing item (corresponding to the training missing item), determines the piece of validation data with the validation missing item as a defective piece of validation data (corresponding to the defective piece of training data), generates a plurality of validation augmented values (corresponding to the plurality of training augmented values) corresponding to the validation missing item of the piece of validation missing data, and generates a plurality of pieces of augmented validation data (corresponding to the plurality of pieces of augmented training data) corresponding to the defective piece of validation data according to the plurality of validation augmented values. In step S18, the processor 110 constitutes the validation dataset at least including said plurality of pieces of augmented validation data and validation data without the validation missing item. Since the performing contents of steps S10-S13 may be applied to the corresponding steps in steps S15-S18, the detailed description of step S15 to step S18 is thus not repeated.

In addition, in step S19, the processor 110 inputs contents of the validation dataset obtained by feature extraction to the prediction model, compares the determination result in the validation dataset marked by a label with the determination result generated by the prediction model, and determines whether an error value of this comparison (for example, the error value may be a ratio of a number of data in which two determinations are the same to a number of the plurality of pieces of validation data) is in a threshold range (for example, the error value is larger than 90%) or not.

Figure 5:
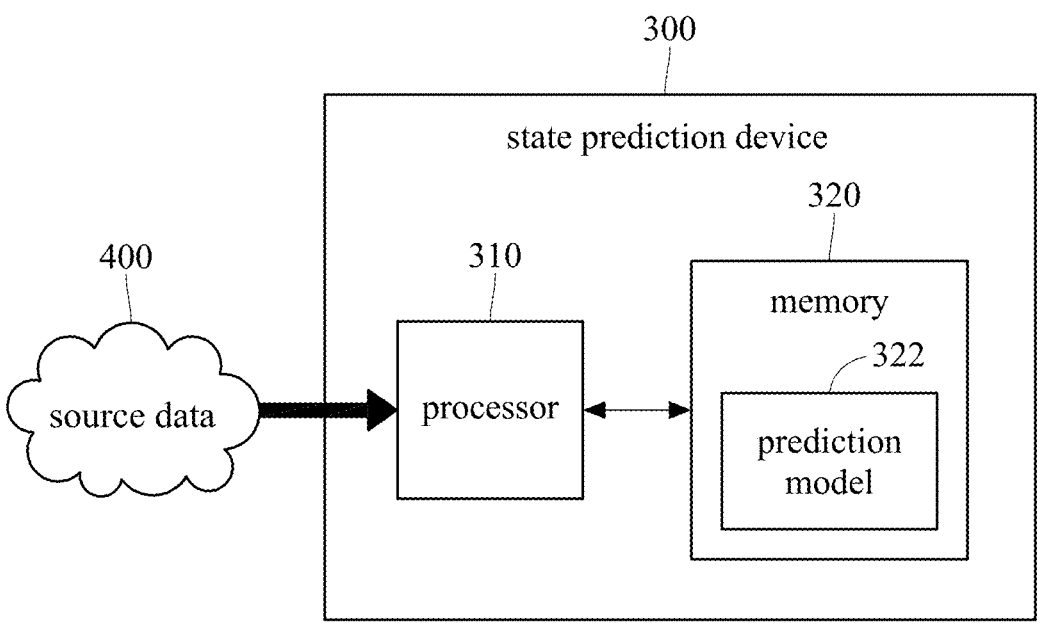
FIG. 5 is a system configuration diagram of the state prediction device according to one embodiment of the present disclosure.

Please refer to FIG. 5, which is a system configuration diagram of the state prediction device according to one embodiment of the present disclosure. Similar to the prediction-model-building device 100 of the prediction model as illustrated by FIG. 2, the state prediction device 300 in the present embodiment comprises a processor 310 and a memory 320. The processor 310 is coupled to the memory 320, and the processor 310 and the memory 320 may be disposed in a server. Alternatively, the processor 310 is disposed in a server and the server is internet-connected to the memory 320. The memory 320 is mainly configured to store the prediction model 322 to provide the prediction model 322 to the processor 310 to access. In the present embodiment, the processor 310 at least performs the following state prediction method based on source data transmitted by a data source 400 to generate a state predicting result.

Figure 6:
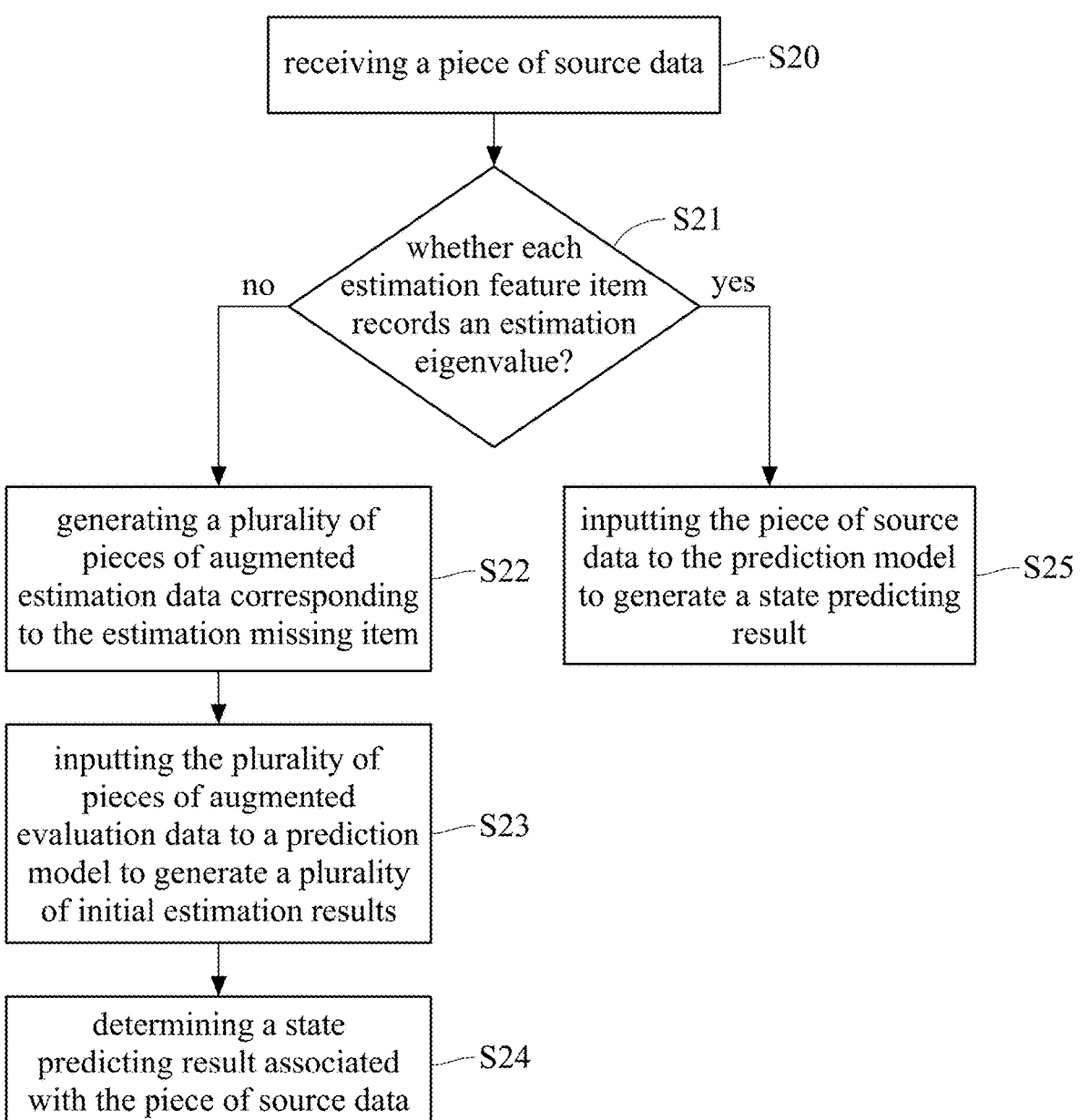
FIG. 6 is a flowchart of the state prediction method according to one embodiment of the present disclosure.

Please refer to FIG. 1 and FIG. 6, while FIG. 6 is a flowchart of the state prediction method according to one embodiment of the present disclosure. The state prediction method in the present embodiment corresponds to the state prediction determination stage A3 shown in FIG. 1 and comprises steps S20-S25. Specifically, the state prediction method may perform data preprocessing to process the piece of source data in order to generate a reasonable state predicting result under the circumstance that the piece of source data is defected. The data preprocessing of the state prediction method is the same with the data preprocessing of the training stage A1 for the plurality of pieces of training data and the validation stage A2 for the plurality of pieces of validation data. Please refer to FIG. 5 as well. In comparison with the foregoing training stage A1, in steps S20-S22 of the state prediction determination stage A3, a piece of source data different from the plurality of pieces of training data is received, and contents similar to those of steps S10-S12 are carried out. However, the piece of source data merely includes contents for feature extraction and does not comprise a determination result with a label. For example, when the state prediction method is applied to predicting the sleep breath state, the piece of source data may be contents as listed in the following table 3.

TABLE 3

| Data | Gender | Age | Height (cm) | Weight (Kg) | Healthy situation | Radar data | Determination result |
|------|--------|-----|-------------|-------------|-------------------|------------|----------------------|
| Data x | Female | 52 | 157 | Blank | Healthy | Radar data x | |

Specifically, in step S20, the processor 310 receives the piece of source data (similar to a piece of training data), which comprises a plurality of estimation feature items (corresponding to the plurality of training feature items) and each of the plurality of estimation feature items is used to record an estimation eigenvalue (corresponding to the training eigenvalue). In step S21, the processor 310 determines whether each of the plurality of estimation feature items records the estimation eigenvalue or not. In step S22, the processor determines the estimation feature item without the estimation eigenvalue as an estimation missing item (corresponding to the training missing item), generates a plurality of estimation augmented values (corresponding to the plurality of training augmented values) corresponding to the estimation missing item, and generates a plurality of pieces of augmented estimation data (corresponding to the plurality of pieces of augmented training data) based on the plurality of estimation augmented values. Afterward, the processor 310 inputs the plurality of pieces of augmented estimation data to the prediction model to generate a plurality of initial estimation results. Based on table 3, the plurality of pieces of augmented estimation data may be the contents listed in table 4 for example. Similarly, A to H in table 4 are code names for representing eight estimation augmented values of the estimation missing item about "weight".

TABLE 4

| Data | Gender | Age | Height (cm) | Weight (Kg) | Healthy situation | Radar data | Determination result |
|------|--------|-----|-------------|-------------|-------------------|------------|----------------------|
| Data x_1 | Female | 52 | 157 | A | Healthy | Radar data x | Result_1 |
| Data x_2 | Female | 52 | 157 | B | Healthy | Radar data x | Result_2 |
| Data x_3 | Female | 52 | 157 | C | Healthy | Radar data x | Result_3 |
| Data x_4 | Female | 52 | 157 | D | Healthy | Radar data x | Result_4 |
| Data x_5 | Female | 52 | 157 | E | Healthy | Radar data x | Result_5 |
| Data x_6 | Female | 52 | 157 | F | Healthy | Radar data x | Result_6 |
| Data x_7 | Female | 52 | 157 | G | Healthy | Radar data x | Result_7 |
| Data x_8 | Female | 52 | 157 | H | Healthy | Radar data x | Result_8 |

In step S24, the processor 310 determines a state predicting result associated with the piece of source data from the plurality of initial estimation results, and stores or outputs the state predicting result. In step S24, if the state predicting result belongs to label property, the processor 310 regards a mode of the plurality of initial estimation results as the state predicting result; and if the state predicting result belongs to numerical property, the processor 310 adopts a majority voting method, an average method or a minimum deviation method to acquire the state predicting result. Furthermore, when the processor 310 performs step S21 and determines that each of the plurality of estimation feature items records the estimation eigenvalue, the piece of source data is inputted to the prediction model to acquire the state predicting result.

Figure 7:
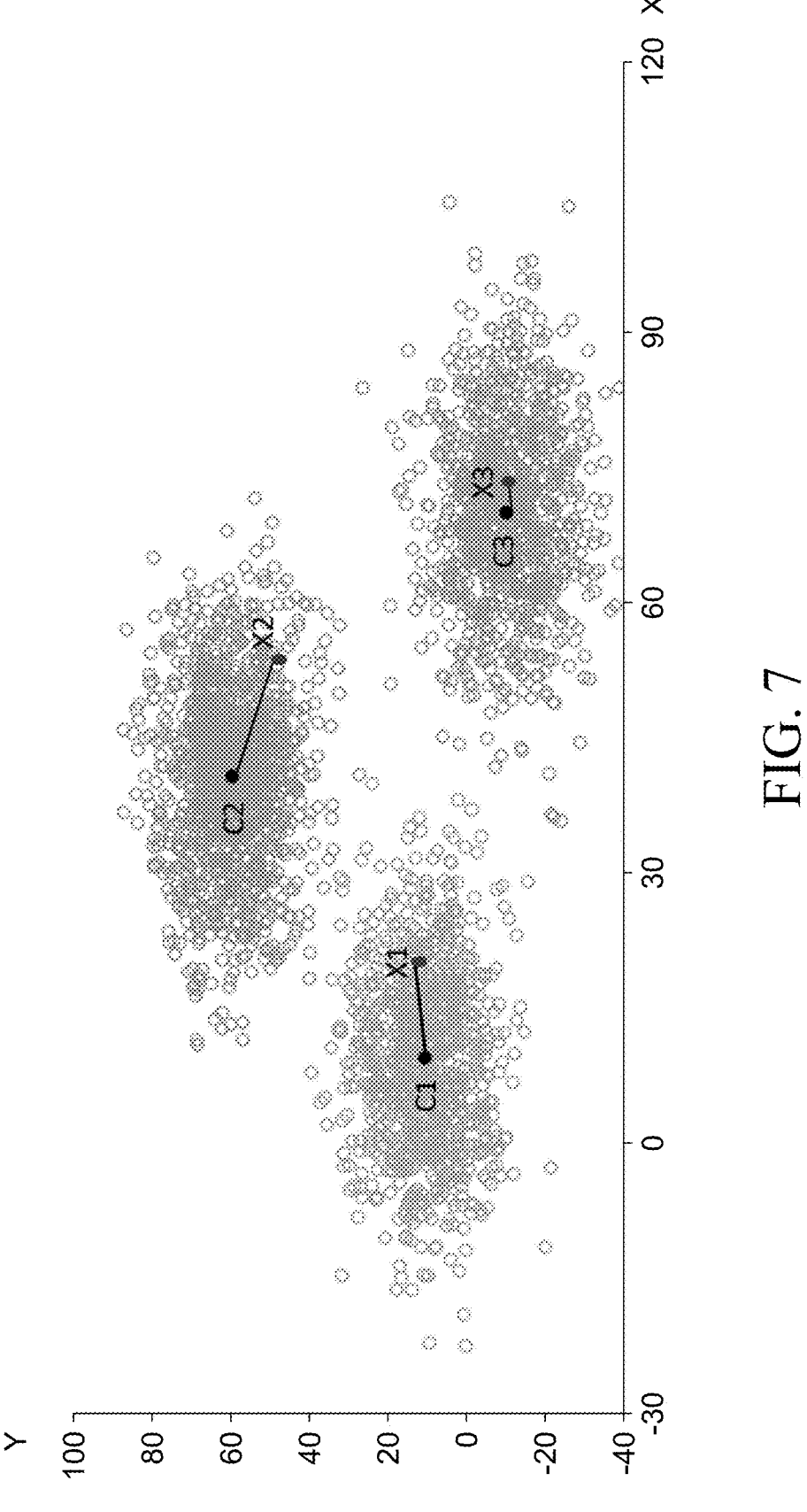
FIG. 7 is a sample of data distribution diagram of the prediction-model-building method in a K-means algorithm serving as the machine-learning algorithm according to one embodiment of the present disclosure.
Figure 8:
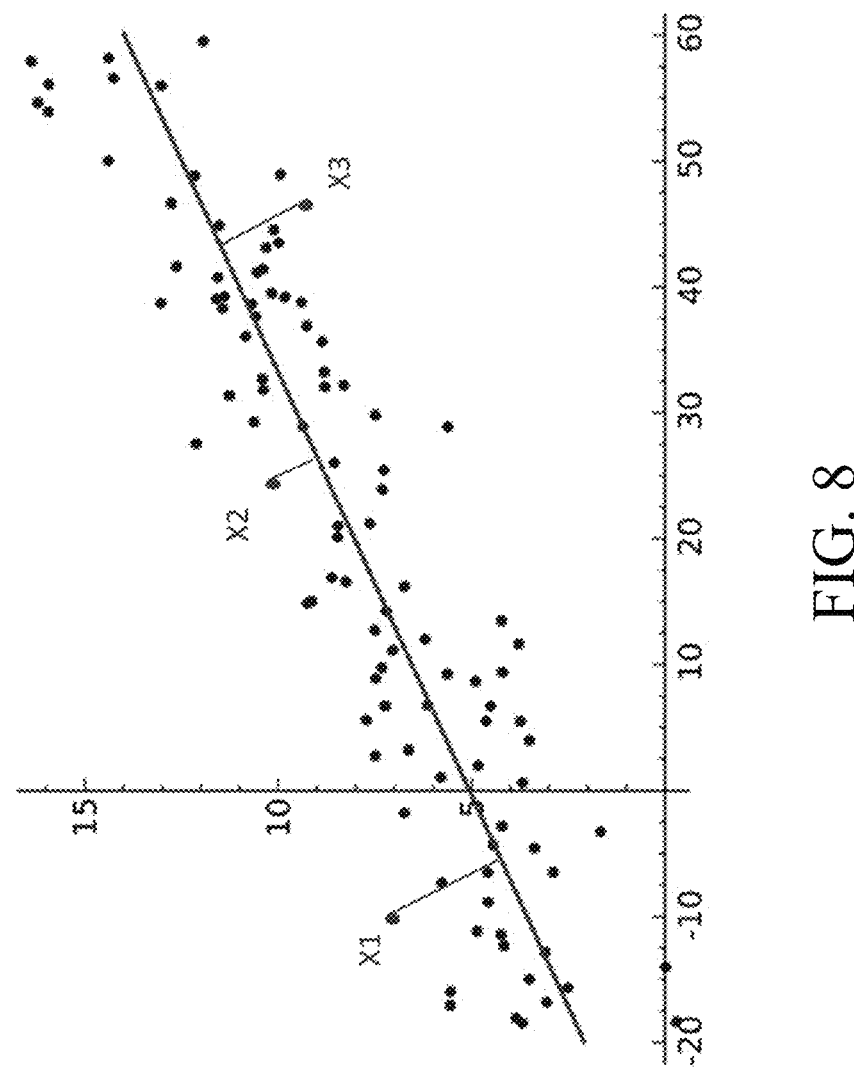
FIG. 8 is a sample of data distribution diagram of the prediction-model-building method in a linear regression algorithm serving as the machine-learning algorithm according to one embodiment of the present disclosure.
Figure 9:
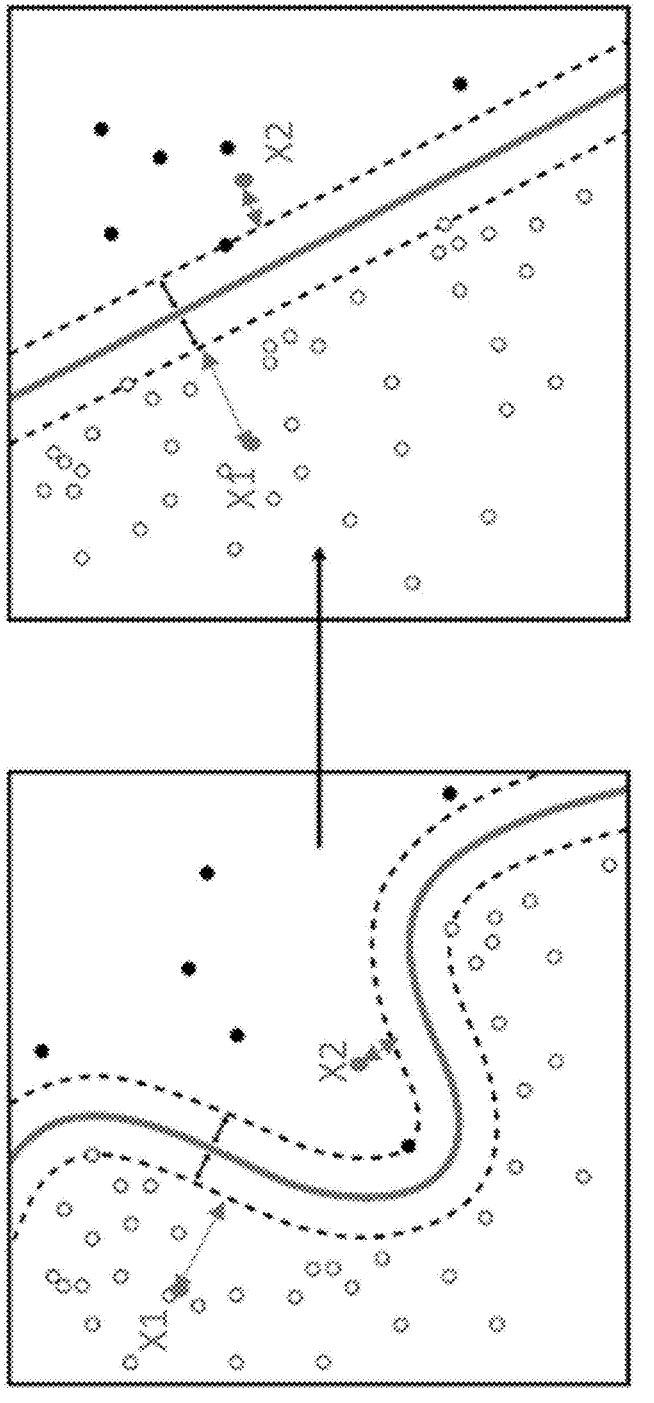
FIG. 9 is a sample of data distribution diagram of the prediction-model-building method in a support vector machine algorithm serving as the machine-learning algorithm according to one embodiment of the present disclosure.
Figure 10:
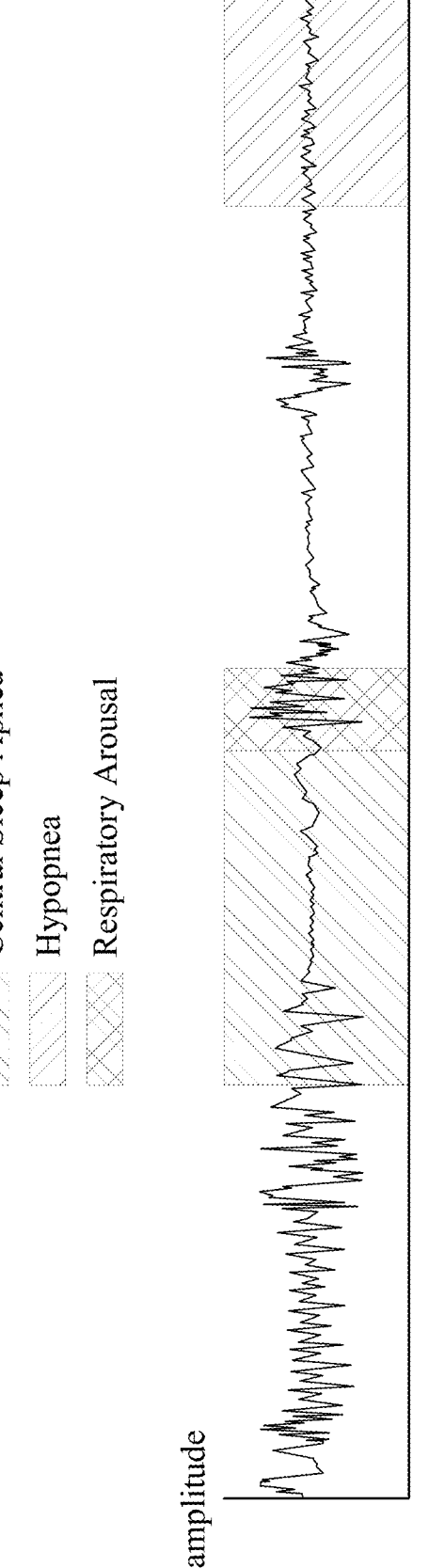
FIG. 10 is a sensed waveform of radar data included in the training data, the validation data or the source data when the prediction-model-building method according to one embodiment of the present disclosure is utilized to determine a sleep breath state.
Figure 11:
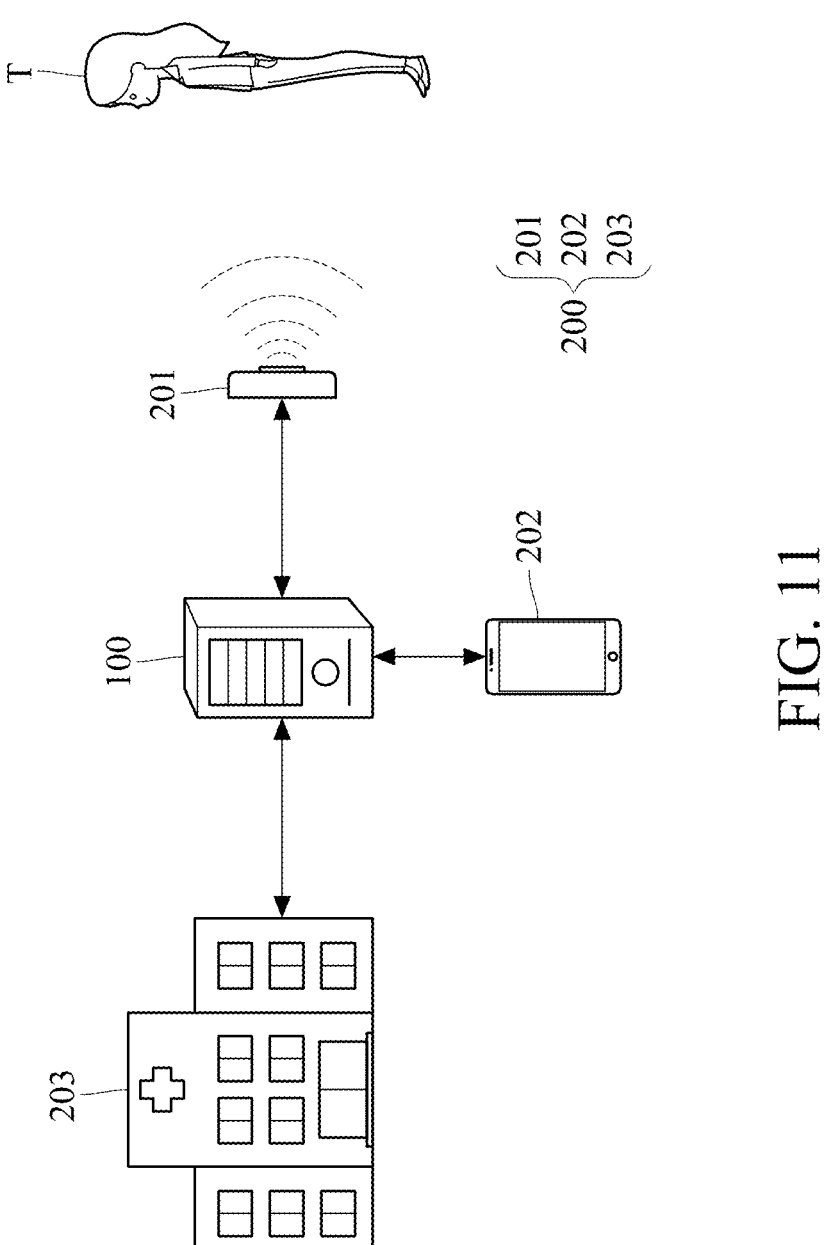
FIG. 11 is a system configuration diagram when the state prediction device according to one embodiment of the present disclosure is utilized to determine a sleep breath state.

According to the aforementioned description, the foregoing prediction-model-building method and the state prediction method may be applied to a prediction system of a sleep breath state to generate the state predicting result associated to central sleep apnea (CSA), hypopnea, respiratory arousal and obstructive sleep apnea. The method of generating the prediction model based on the training dataset by the machine-learning algorithm may be a clustering algorithm illustrated in FIG. 7, a linear regression algorithm illustrated in FIG. 8, or a support vector machine algorithm illustrated in FIG. 9. Moreover, when the prediction-model-building method and the state prediction method of each embodiment of the present disclosure are applied to the prediction system of the sleep breath state, the radar data in the plurality of pieces of training data, the plurality of pieces of validation data and the piece of source data from the data source 200, 400 may be those shown in FIG. 10. Specifically, please refer to FIG. 11, the data source 200 of the plurality of pieces of training data and the plurality of pieces of validation data in the foregoing prediction system may be a medical monitoring device 201, a user input interface 202 and a database 203 of a medical department. Similarly, the source data of the foregoing prediction system may also be the same.

Although embodiments of the present invention are disclosed as the above, it is not meant to limit the scope of the present invention. Any possible modifications and variations based on the embodiments of the present inventions shall fall within the claimed scope of the present invention. The claimed scope of the present invention is defined by the claim as follows.

What is claimed is:

1. A prediction-model-building method, comprising:
receiving a plurality of pieces of training data, with each of the plurality of pieces of training data comprising a plurality of training feature items and with each of the plurality of training feature items configured to record a training eigenvalue;
determining whether each of the plurality of training feature items of each of the plurality of pieces of training data records the training eigenvalue or not;
determining a training feature item without the training eigenvalue as a training missing item, determining a piece of training data comprising the training missing item as a defective piece of training data, generating a plurality of training augmented values corresponding to the training missing item of the defective piece of training data and, based on the plurality of training augmented values, generating a plurality of pieces of augmented training data corresponding to the defective piece of training data;
constituting a training dataset at least comprising the plurality of pieces of augmented training data and pieces of training data without the training missing item; and
training a prediction model by a machine-learning algorithm based on the training dataset, and storing or outputting the prediction model,
wherein the plurality of pieces of augmented training data is a plurality of pieces of first augmented training data, and, before constituting the training dataset, the building method of prediction model further comprises:
duplicating the pieces of training data without the training missing item by a ratio corresponding to a number of the plurality of training augmented values to additionally generate a plurality of pieces of duplicated training data, wherein the plurality of pieces of duplicated training data serves as a plurality of pieces of second augmented training data;
wherein constituting the training dataset comprises:
constituting the training dataset with the plurality of pieces of first augmented training data, the plurality of pieces of second augmented training data and the pieces of training data without the training missing item.

2. The prediction-model-building method according to claim 1, further comprising: performing a validation stage to determine whether the prediction model is updated or not after generating the prediction model, with the validation stage comprising:

receiving a plurality of pieces of validation data, with each of the plurality of pieces of validation data comprising a plurality of validation feature items and wherein each of the plurality of validation feature items is configured to record a validation eigenvalue;

determining whether the plurality of validation feature items of each of the plurality of pieces of validation data record the validation eigenvalue or not;

determining a validation feature item without the validation eigenvalue as a validation missing item, determining a piece of validation data comprising the validation missing item as a defective piece of validation data, generating a plurality of validation augmented values corresponding to the validation missing item of the defective piece of validation data and, based on the plurality of validation augmented values, generating a plurality of pieces of augmented validation data corresponding to the defective piece of validation data;

constituting a validation dataset at least comprising the plurality of pieces of augmented validation data and pieces of validation data without the validation missing item among the plurality of pieces of validation data; and inputting the validation dataset to the prediction model to obtain a comparison result and selectively updating the prediction model based on the comparison result.

3. The prediction-model-building method according to claim 1, wherein the plurality of training feature items comprises at least one non-measured feature item not obtained by measurement, and determining whether the plurality of training feature items of each of the plurality of pieces of training data records the training eigenvalue or not comprises:

determining whether the non-measured feature item records the training eigenvalue or not.

4. The prediction-model-building method according to claim 3, wherein the non-measured feature item is associated with a body feature and the prediction model is used to generate a prediction result associated with at least one of the following states:

central sleep apnea (CSA), hypopnea, respiratory arousal and obstructive sleep apnea (OSA).

5. The prediction-model-building method according to claim 1, wherein generating the prediction model by the machine-learning algorithm based on the training dataset comprises: generating the prediction model by a clustering algorithm serving as the machine-learning algorithm.

6. The prediction-model-building method according to claim 1, wherein generating the prediction model by the machine-learning algorithm based on the training dataset comprises: generating the prediction model by a linear regression algorithm serving as the machine-learning algorithm.

7. The prediction-model-building method according to claim 1, wherein generating the prediction model by the machine-learning algorithm based on the training dataset comprises: generating the prediction model by a support vector machine algorithm serving as the machine-learning algorithm.

8. The prediction-model-building method according to claim 1, wherein generating the plurality of training augmented values corresponding to the training missing item of the defective piece of training data comprises:

obtaining a plurality of training eigenvalues corresponding to the pieces of training data without the training missing item among the plurality of pieces of training data;

classifying the training eigenvalues to obtain a plurality of classified representative values; and setting the plurality of classified representative values as the plurality of training augmented values;

wherein the training eigenvalues are respectively recorded in the training feature items of the plurality of pieces of training data, and the training feature item corresponds to the training missing item.

9. The prediction-model-building method according to claim 1, wherein generating the plurality of training augmented values corresponding to the training missing item of the defective piece of training data comprises:

determining an acquisition range of the training missing item based on at least one training eigenvalue of the defective piece of training data, and wherein the at least one training eigenvalue is recorded in at least one training feature item other than the training missing item of the defective piece of training data; and selecting a plurality of numerical values from the acquisition range as the plurality of training augmented values.

10. A state prediction method comprising:

receiving a piece of source data, with the piece of source data comprising a plurality of estimation feature items and with each of the plurality of estimation feature items configured to record an estimation eigenvalue;

determining whether each of the plurality of estimation feature items records the estimation eigenvalue or not;

determining the estimation feature item without the estimation eigenvalue as an estimation missing item, generating a plurality of estimation augmented values corresponding to the estimation missing item and, based on the plurality of estimation augmented values, generating a plurality of pieces of augmented estimation data;

inputting the plurality of pieces of augmented estimation data to a prediction model built according to the prediction-model-building method of claim 1 to generate a plurality of initial estimation results; and determining a state predicting result associated with the piece of source data from the plurality of initial estimation results and storing or outputting the state predicting result.

11. The state prediction method according to claim 10, wherein determining a state predicting result associated with the piece of source data from the plurality of initial estimation results comprises: taking a mode of the plurality of initial estimation results as the state predicting result.

12. The state prediction method according to claim 10, wherein determining a state predicting result associated with the piece of source data from the plurality of initial estimation results comprises: taking an average the plurality of initial estimation results as the state predicting result.

13. The state prediction method according to claim 10, wherein the plurality of initial estimation results is associated with at least one of the following states:

central sleep apnea (CSA), hypopnea, respiratory arousal and obstructive sleep apnea (OSA).

14. The state prediction method according to claim 10, wherein generating a plurality of estimation augmented values corresponding to the estimation missing item comprises:

determining an acquisition range of the estimation missing item based on at least one estimation eigenvalue of the piece of source data, and wherein the at least one estimation eigenvalue is recorded in at least one estimation feature item other than the estimation missing item of the piece of source data; and selecting a plurality of numerical values as the plurality of estimation augmented values from the acquisition range.

15. A prediction-model-building device comprising:

a memory storing a machine-learning algorithm; and a processor coupled to the memory to access the machine-learning algorithm and performing the prediction-model-building method according to claim 1.

16. The prediction-model-building device according to claim 15, wherein the processor is disposed in a server, and the server is internet-connected to the memory.

17. The prediction-model-building device according to claim 15, wherein the processor and the memory are disposed in a server.

18. A state prediction device comprising:

a memory storing a prediction model; and a processor coupled to the memory to access the prediction model and performing the state prediction method according to claim 10.

19. The state prediction device according to claim 18, wherein the processor is disposed in a server, and the server is internet-connected to the memory.

20. The state prediction device according to claim 18, wherein the processor and the memory are disposed in a server.

* * * * *